United States Patent
Gudeman

(10) Patent No.: US 10,302,871 B2
(45) Date of Patent: May 28, 2019

(54) MICROFABRICATED FIBER OPTIC PLATFORM

(71) Applicant: Innovative Micro Technology, Goleta, CA (US)

(72) Inventor: Christopher S. Gudeman, Lompoc, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 15/974,516

(22) Filed: May 8, 2018

(65) Prior Publication Data

US 2018/0335575 A1 Nov. 22, 2018

Related U.S. Application Data

(60) Provisional application No. 62/508,441, filed on May 19, 2017.

(51) Int. Cl.

| | |
|---|---|
| *G02B 6/00* | (2006.01) |
| *G02B 6/36* | (2006.01) |
| *G02B 6/44* | (2006.01) |
| *H01S 5/183* | (2006.01) |
| *G02B 6/35* | (2006.01) |
| *H01S 5/00* | (2006.01) |

(52) U.S. Cl.
CPC ......... *G02B 6/3652* (2013.01); *G02B 6/3596* (2013.01); *G02B 6/3608* (2013.01); *G02B 6/4471* (2013.01); *H01S 5/0064* (2013.01); *H01S 5/18366* (2013.01)

(58) Field of Classification Search
CPC .. G02B 6/4452; G02B 6/3897; G02B 6/4471; G02B 6/4457; G02B 6/4446; G02B 6/00
See application file for complete search history.

(56) References Cited

U.S. PATENT DOCUMENTS

| | | | |
|---|---|---|---|
| 6,456,766 B1 * | 9/2002 | Shaw | G02B 6/30 385/47 |
| 8,798,410 B2 * | 8/2014 | Feng | H01L 31/105 257/E33.077 |
| 2003/0016415 A1 * | 1/2003 | Jun | G02B 6/12002 398/91 |

* cited by examiner

*Primary Examiner* — Jennifer Doan
(74) *Attorney, Agent, or Firm* — Jaquelin K. Spong

(57) ABSTRACT

Described here is a platform for supporting a fiber optic cable. The platform may be made on a silicon wafer using silicon lithographic processing techniques. The platform may include a substrate having a top planar surface; a trench formed in the substrate in the top planar surface and dimensioned to accept a fiber optic cable carrying radiation; and a reflecting surface formed in the top planar surface, wherein this reflecting surface is configured to reflect the radiation by total internal reflection, wherein the reflecting surface is configured to direct radiation travelling in a first direction into a second direction, substantially orthogonal to the first direction.

22 Claims, 6 Drawing Sheets

MICROFABRICATED FIBER OPTIC PLATFORM

CROSS REFERENCE TO RELATED APPLICATIONS

This nonprovisional U.S. Patent Application claims priority to U.S. Provisional Application Ser. No. 62/508,441, filed May 19, 2017 and incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to a platform for fiber optic cabling for optical data multiplexing, and methods to align the fiber optic carriers to the laser sources and photonic chips.

Radiation-based, optical communications systems are increasingly popular in data centers that support the "cloud", because of their intrinsically high data rate compared to lower frequency carriers. On the macroscale, optical data centers use thousands of optical fibers to interconnect the servers to one another. Ideally the technicians who maintain this web of interconnections could unplug one patch cable and plug in a new patch cable or a patch cable that provides a different multiplexing path much in the same way that one plugs a video cable into a television. Because the patch cable is optical and not electrical, the alignment of the myriad fibers is critical to data integrity. Also, dirt and particles can attenuate the optical path and affect data integrity. Ideally a technician could reach around to the back of the rack, disconnect the old patch cable and connect the new without being able to see the connectors.

On the microscale, optical communication applications employ a diverse set of micro-optical components. For this plurality of components, as a light beam traverses each material interface along an optical path, there is loss of optical power at each interface. This loss is generally minimized by a tedious alignment process that maximizes the system throughput and thus requires that optical power be present. Micron-level position tolerances (often sub-micron) are generally required to achieve best performance. This is further complicated by the necessity for 6-axis placement control (x, y, z, pitch, roll and yaw) and mode matching, wherein the latter refers to the numerical aperture or cone angle of a converging or diverging light beam. The refractive index change at each of the transitions causes reflections, which produce interfering scattered light and further increase losses and can be a source of noise.

Thus, complicated thin film stacks are required to form anti-reflection coatings to manage or reduce these losses. Ideally, such multilayer structures can be deposited on easily accessible surfaces for manufacturability and low cost. However, in many such systems, these multilayers are not on exposed surfaces, making them difficult to fabricate.

Supporting and disposed alongside these micro components are photonics circuits, fibers, optical waveguides, lenses, semiconductor lasers, gratings, isolators, mirrors, transparent thin films which are generally employed to create complex systems that can launch laser-generated light into a modulator that imposes a data stream onto the light. The modulated data stream is then inserted into an optical fiber. Because light from a semiconductor laser diverges from the emitting facet of the laser at an extremely high angle (20-40 degrees HWHM), a micro-lens must be precisely placed in close proximity to the laser. The placement and alignment of these components to form a laser micro-package (LMP) is described in U.S. patent application Ser. No. 14/931,883. Using a vertical grating coupler described in U.S. patent application Ser. No. 14/931,883, the light from the LMP can be injected into an optical circuit such as a photonics chip where a Mach-Zehnder interferometer imposes data on the light stream. The light stream then can be coupled into an optical fiber by butt-coupling the fiber onto a second vertical grating coupler. Generally packaging space constraints dictate that this output fiber be bent at a very small radius of curvature, resulting in yield loss, optical loss and reliability failures.

What is needed is an assembly mount or platform that provides precise datums for component registration and highly accessible surfaces to enable accurate and low cost anti-reflection coating processes. The platforms must provide microscopic datums and be manufacturable at low cost.

SUMMARY

Silicon provides an ideal substrate for most MEMS applications in part because of the vast selection of processes and tooling available for modifying a silicon wafer. This extreme precision to which lines and pockets and protrusions can be formed would be ideal for optical applications, because very tight alignment precision is required for optimal performance of an optical system. Unfortunately Si is opaque for much of the electromagnetic spectrum. Only at wavelengths longer than ~1.3 um does silicon become transparent. For a class of semiconductor laser referred to as an edge emitting laser, which lases at wavelengths longer than 1.3 um, Silicon can be used as a transmissive material and the full benefits of precision micro-machining of Silicon can be realized.

The optical platform described here uses surfaces etched into the silicon surface and reflective and/or refractive surfaces. The platform may support a fiber optic cable, and may include a substrate having a top planar surface, a trench formed in the substrate in the top planar surface and dimensioned to accept a fiber optic cable; and a reflecting surface formed in the top planar surface configured to reflect radiation by total internal reflection, wherein the reflecting surface is configured to direct radiation travelling in a first direction into a second direction, substantially orthogonal to the first direction.

In some embodiments, the first direction may be parallel to the top planar surface and the second direction may be substantially perpendicular to the planar surface.

The platform may also use discrete components, such as ball lenses, to reshape the bean of light. These components may be disposed with very high precision, into a pocket lithographically etched into the semiconductor material.

We describe here a method that employs etched cavities in the silicon substrate to seat or self-align discrete components such as ball lenses, and etched trenches to precisely align and retain optical fibers and fiber bundles, especially with respect to the discrete components.

In addition, we describe here a device that provides low loss coupling of the light emanating vertically from a surface into an optical fiber. This platform may used KOH etched pockets to seat ball lenses. It may also include an integrated prism to turn the direction of the light into an orthogonal direction, for example from a vertical to a horizontal plane. The platform may include a ball lens matching the numerical aperture of the fiber optic cable, such that the light can be efficiently injected into the fiber. The platform may provide lithographically defined datums for sub-micron placement precision of the fiber, the lens, and the prism.

These methods can be made at extremely low cost due to the highly parallel nature of silicon wafer processing, using semiconductor-like wafer processing. The fabrication method may result in surfaces that are easily accessible for the deposition of high quality anti-reflection coatings.

These and other features and advantages are described in, or are apparent from, the following detailed description.

BRIEF DESCRIPTION OF THE DRAWINGS

Various exemplary details are described with reference to the following figures, wherein.

It should be understood that the drawings are not necessarily to scale, and that like numbers may refer to like features.

DETAILED DESCRIPTION

Figure 1:
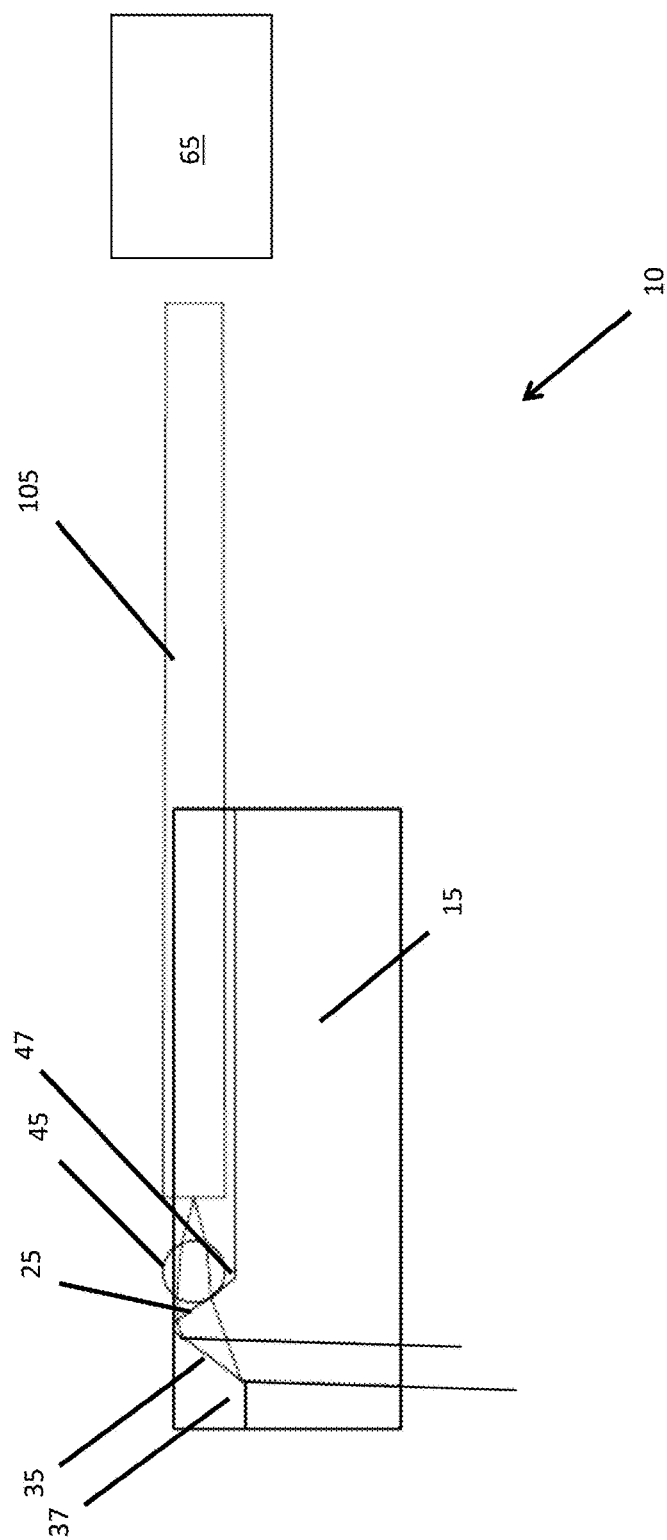
FIG. 1 is a schematic cross sectional view of a microfabricated fiber mount with trenches and voids formed therein.

The following discussion presents a plurality of exemplary embodiments of the novel fiber optic mounting system. The following reference numbers are used in the accompanying figures to refer to the following:

10, 11 fiber optic platform device
15 silicon substrate
25 AR inclined wall
27 first trench
35 reflective surface
37 second adjacent trench
45 ball lens
47 lens depression
55 isolator
65 radiation source
105 fiber optic
125 photonic chip
135 emitter
145 receiver An exemplary embodiment of the microfabricated fiber optic platform is shown in FIG. 1. The microfabricated fiber optic platform may be easily constructed from a silicon wafer, but glass, AlN, sapphire may be suitable alternative substrates. Etched features such as voids or trenches may be formed lithographically in the silicon, with great precision. A precise trench may provide positioning for an optical element, such as an optical fiber. A ball lens may also reside in this trench. Alternatively, the ball lens may be disposed in another void, wherein the other void is located very precisely with respect to the trench. The v-shaped sidewalls of the trench or void may provide precise x, y, z pitch, roll and yaw alignment of these components, as described further below.

The trench or void may be v-shaped in cross section, as a result of the etching process used to create the trench or void. The characteristics of these surfaces may be used to provide other functions, such as reflective or refractive surfaces. One side wall of the voids or trenches may form one facet of a turning prism, for example, wherein the side wall is the 54 degree left v-shaped surface at the end of the trench. The other facet of the turning prism may be the right v-shaped sidewall of the adjacent trench.

For an anisotropic etch in a single crystal <100> Si wafer, the facet angles will be 54 degrees. This angle of 54 degrees may be suitable for forming a reflective surface for radiation traveling in the bulk material of the substrate. In other words, this material interface may form a boundary that causes total internal reflection of the optical radiation at that boundary.

Accordingly, the left facet of the prism (which is the right sidewall of the adjacent trench, see accompanying figures) may serve as a mirror in a mode where total internal reflection provides nearly perfect (100%) reflectance. The right facet of the prism is anti-reflection coated to provide >98% transmittance of the light beam as it exits or enters the silicon. Please refer to FIG. 1 which shows the platform in a cross sectional view, and FIG. 2(a) which shows an end-on view, and FIG. 2(b) which shows a plan view.

The ball lens may be placed at the left end of the trench such that it rests against the two long sidewalls and the left end sidewall. These sidewalls are created with submicron precision using conventional semiconductor lithography techniques. The fiber can be laid into the trench and positioned so its end rests against and abuts the ball lens. This assembly can now be placed over the light source whose light path is vertical or nearly vertical and secured by an appropriate adhesive. Such a light source may be a vertical grating coupler, a VCSEL, or an edge emitting laser, for example. Accordingly, one function of this platform is to accept radiation entering the silicon substrate perpendicular to its planar surface, and redirecting the radiation into a direction parallel to this planar surface. Alternatively, the platform may take light propagating parallel to this planar surface and redirect it perpendicularly. These characteristics are described below with respect to various exemplary embodiments.

FIG. 1 shows the platform device in cross section. The device may include a radiation device 65, a fiber optic cable 105, a ball lens 45 and a silicon substrate 15. Voids 27 and 37, along with side surfaces 25 and 35, may have been formed in the substrate previously, by for example, a chemical etch. The microfabricated fiber optic platform allows these elements to be placed precisely, securely, predictably and reliably.

As mentioned previously, a chemical etch of a single crystal silicon substrate may yield a void with sidewalls inclined to the 100 silicon surface with an angle of 54 degrees. The substrate is exposed to the etchant in order to create a void for seating a ball lens and a void for seating a fiber optic cable. The etch depth will be determined by the etch time, except in the case where the etch is self-terminating. A complete description of the chemical etch process can be found in MEMS textbooks, such as that by Prof Marc Madou.

A radiation device, 65, for example, an edge emitting laser or a VCSEL may emit radiation that is launched into an optical fiber 105, which transmits the radiation to a collimating ball lens 45. The radiation then impinges on a reflective surface 35, which redirects the horizontal light into vertical light. The vertical light may then be emitted from the backside, or obverse side of the substrate 15. Conversely, the light can be launched from the bottom of the substrate, with the radiation traversing the reverse path. It should be understood that depending on the details of the application, the radiation device 65 may be a detector rather than an emitter.

Figure 2:
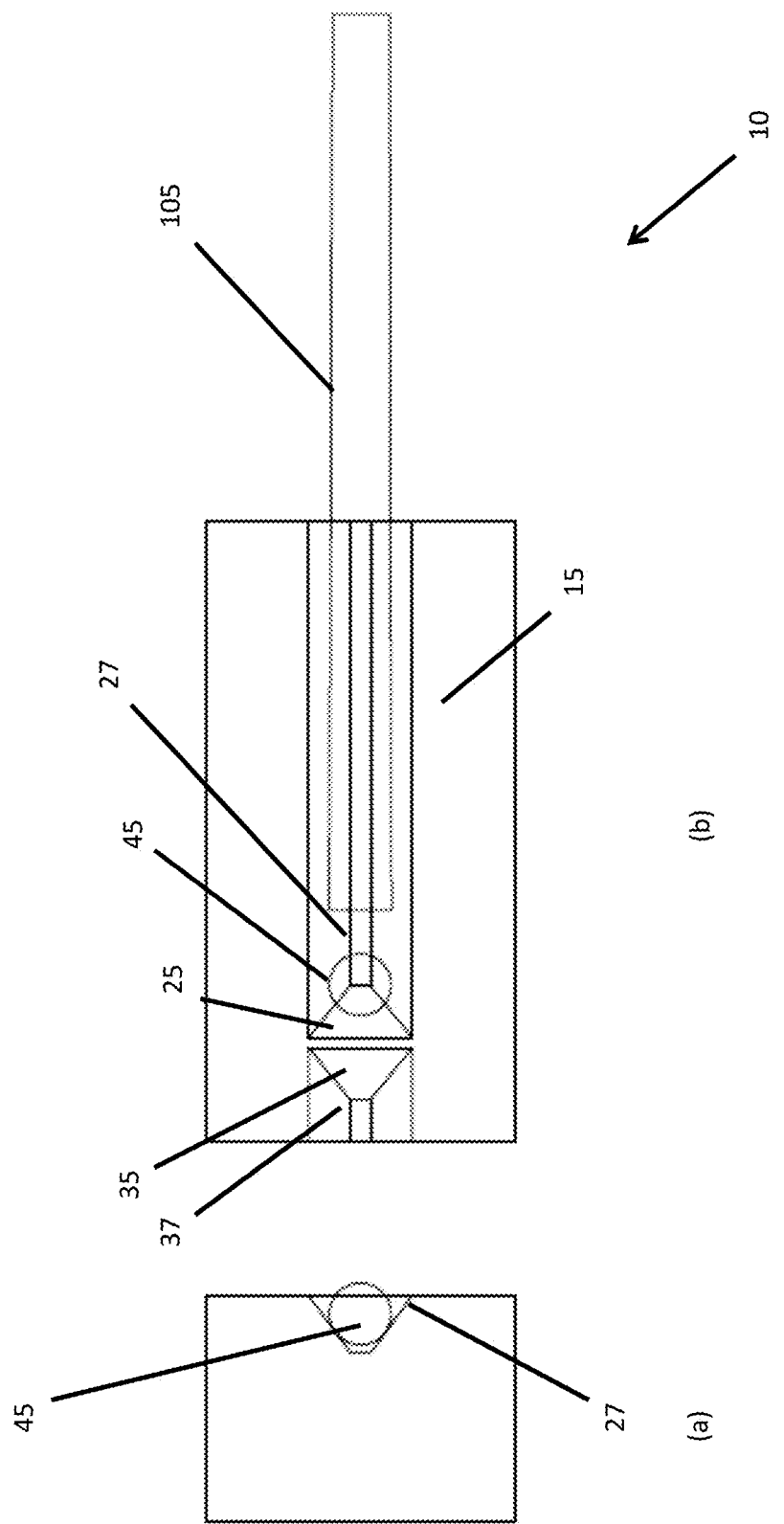
FIG. 2 is a schematic view of a microfabricated fiber optic mount: (a) end view and (b) plan view.

Accordingly, as is shown perhaps more clearly in FIG. 2, a first trench 27 may be etched into the <100> plane of a silicon substrate 15. This trench 27 may be dimensioned to accept a fiber optic cable 105 in trench 27. Because of the nature of the etching process used to create the trench 27, a resulting wall 25 inclined at a 54 degree angle with respect to the horizontal plane of the substrate 15 may be formed. This surface may be provided with an antireflective coating designed to minimize the reflection of radiation of the laser.

A ball lens 45 may be chosen with a diameter about the same as the diameter of the fiber optic 105. In this case, the depth of the void 47 created for the ball lens 45 will be about as deep as the trench etched for the fiber optic cable 105. The sidewalls of these voids 47 will be at an angle of about 54 degrees with respect to the substrate surface.

In other embodiments, a large ball lens may be selected having a different size and focal length, and thus requiring a deeper/shallower void 47. A mask may be designed with a larger/smaller aperture in the location of the ball lens 45. Accordingly, a larger area will result in a larger void.

A second trench 37 may be formed in an adjacent area on the substrate. The purpose of this void is to create the reflecting surface 35 which was shown in FIG. 1. At this angle, an incident ray of radiation is reflected by total internal reflection (TIR). Accordingly, the surface 35 may redirect light traveling horizontally to the surface of the substrate 15 to a direction substantially vertical to the surface of the substrate 15. More generally, the reflecting surface may be configured to direct radiation travelling in a first direction into a second direction, substantially orthogonal to the first direction. In some embodiments, the first direction is parallel to the top planar surface of the substrate 15, and the second direction is substantially perpendicular to the planar surface of the substrate 15, or vice versa.

As shown in FIG. 1, the ball lens 45 may be placed in the etched trench 27 and resting against the 54 degree endwall 25 of the fiber optic trench 27. Thus supported in two places, the ball lens 45 may be located with respect to the fiber optic cable 105 in a secure and invariant way.

FIG. 2 shows the fiber optic platform in (a) in an end view, showing the location of the ball lens 45 held securely in the void 47. As can be seen in FIG. 2(*a*), the bottom of the ball lens 45 may not be in contact with the substrate surface, but is instead held securely by the 54 degree sidewalls 25, which provide precise datums in x, y and z directions.

FIG. 2 also shows the device in plan view (b), showing again the ball lens 45 and fiber optic cable 105. As can be seen in FIG. 2(*b*) the etching of the adjacent cavity 37 may form the reflecting surface 35 for the radiation carried by the fiber optic cable 105. Accordingly, the two voids 27 and 37 both have 54 degree walls. The end wall 25 associated with void 25 may form a seating reference point for the ball lens 45. The 54 degree end wall 35 associated with void 37 may form a reflective surface 35 for the radiation.

Figure 3:
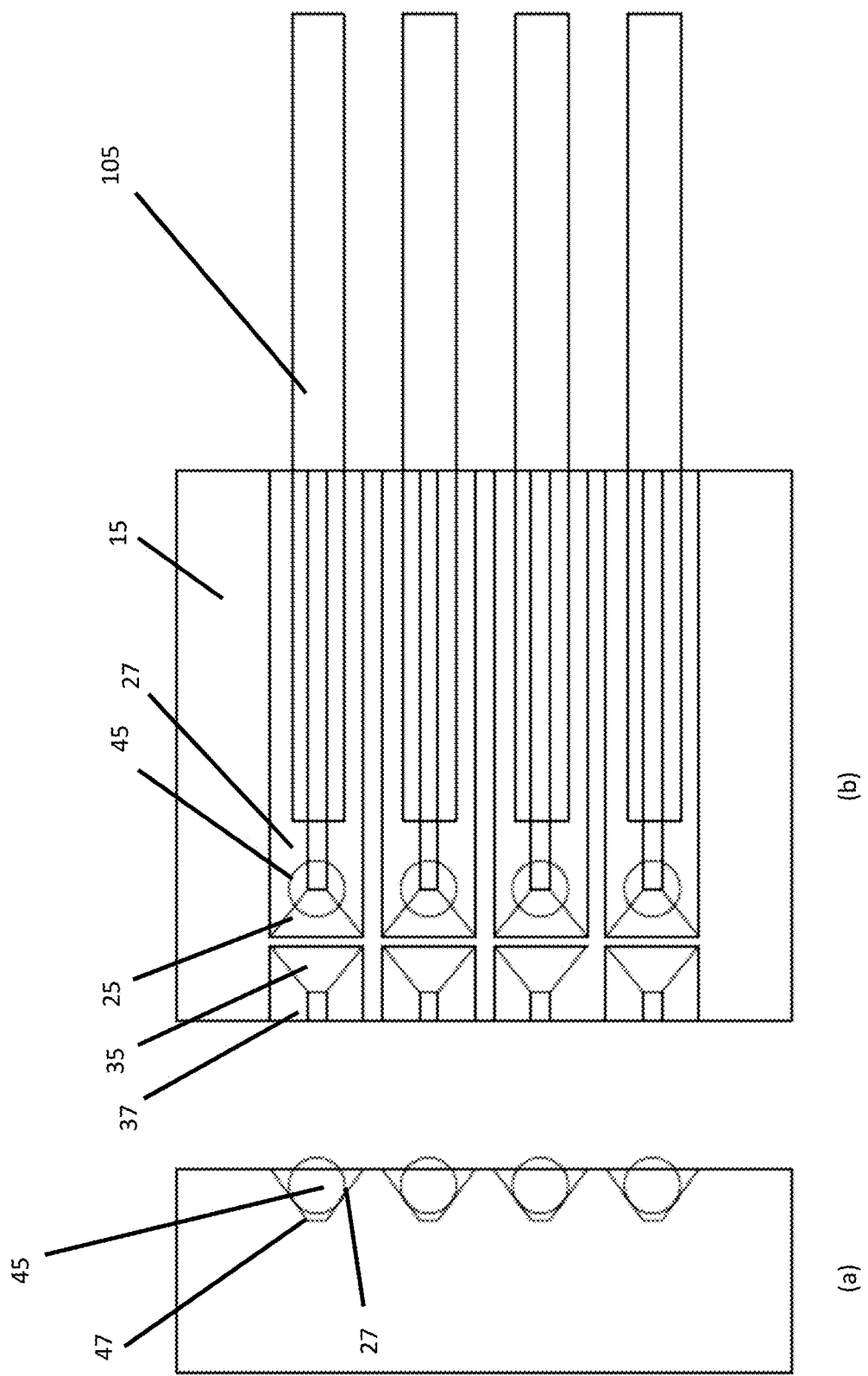
FIG. 3 is a schematic view of a quad microfabricated fiber optic platform. (a) shows an end view of the microfabricated fiber optic platform and (b) shows a plan view of the microfabricated fiber optic platform.

FIG. 3 shows a plurality of fiber optic platforms being manufactured together, as a batch process, on a silicon substrate. In FIG. 3, the end view is shown in (a) of the plurality of such fiber optic mounts fabricated on a substrate. As before, ball lenses 45 are disposed at the output facet of a fiber optic cables 105, in the trench that locates the fiber optic cables 105. The ball lenses may rest against the 54 degree facet, adjacent the second 54 degree reflecting surface.

FIG. 3(*b*) shows the plan view, showing again the ball lens 45 and fiber optic cable 105. As can be seen in FIG. 3(*b*), the etching of the adjacent cavity 37 may form the reflecting surface 35 for the radiation carried by the fiber optic cable 105.

Figure 4:
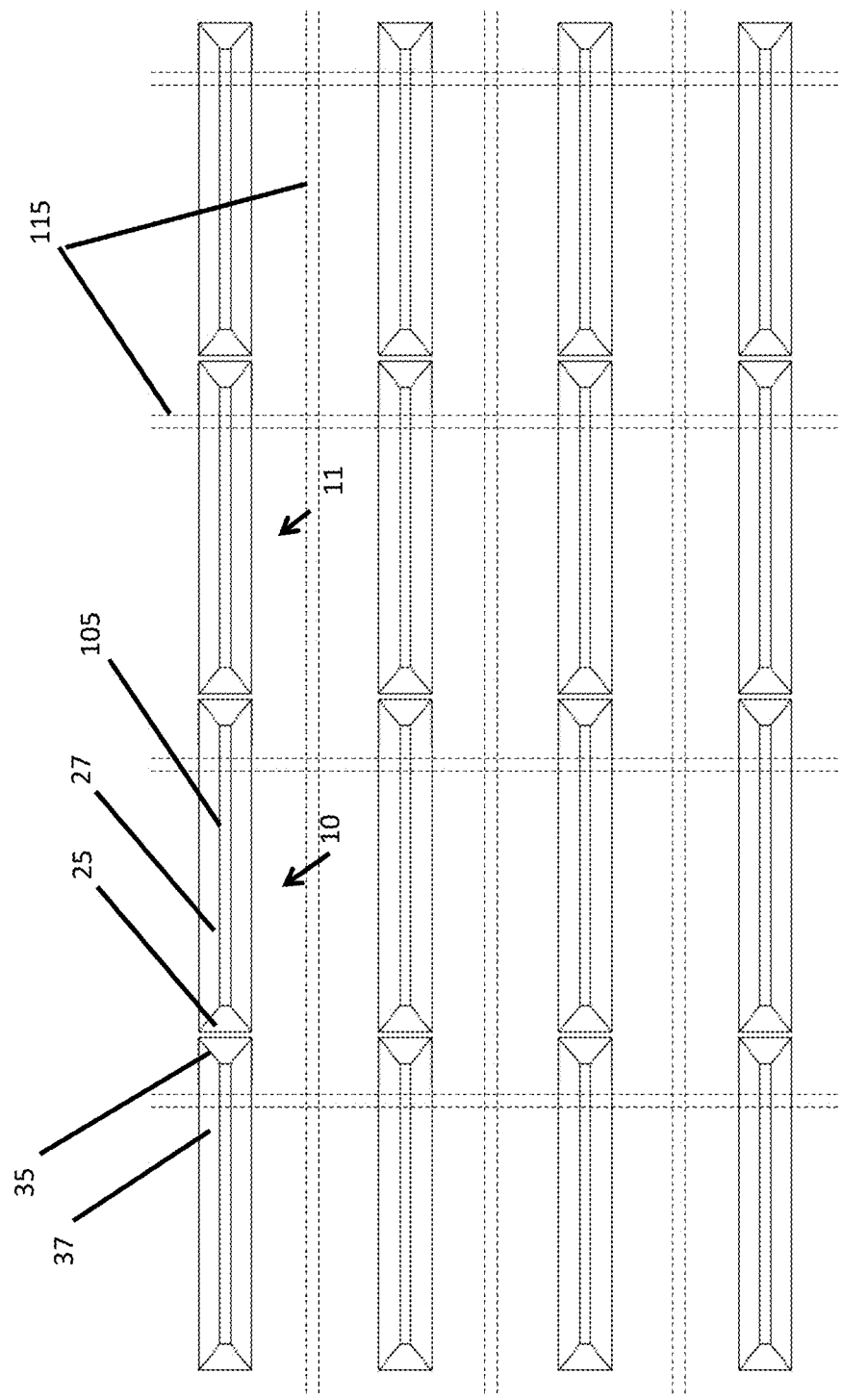
FIG. 4 is a schematic top down view of a plurality of microfabricated fiber optic mounts prior to separation by dicing.

FIG. 4 shows a wafer in the fabrication process, showing the trench voids 25 and the lens voids 35. The fiber optic voids for fiber optic cable 105 are also shown. The dashed lines 115 may be the dicing "streets", that is, the area devoting to allowing a saw blade to separate the devices. The streets 115 may form a perimeter around the individual devices formed on the substrate, such as device 10 and device 11. Each of these devices 10 and 11 may be an individual fiber optic platform, as described above.

As can be seen in FIG. 4, each device 10 may accept a fiber optic cable 105 and a ball lens 45. The first trench 27 may accept a first fiber optic cable 105. The second adjacent trench 37 may form the reflecting surface 35 for device 10. However, after dicing along the streets 115, the residual second trench may be used to accept another fiber optic cable. In essence, a second silicon fiber optic mount 11 is formed adjacent the first silicon fiber optic mount 10. Accordingly, the silicon fiber optic mount 10 may be manufactured very simply and in high volume at high yield.

As shown in FIG. 4, a substantial number of devices may be manufactured on a single substrate. Using the wafer layout where a repeating pattern of trenches are etched into a wafer, the etched side of the wafer can be easily coated with a highly efficient anti-reflection coating. Following this the back side can then be similarly coated. The antireflective coating may be a multilayer stack wherein the layer thicknesses are chosen to reduce or minimize reflections at the output wavelength of the laser 65. Of course, this is exemplary, and the antireflective film may be tuned to any particular wavelength.

Finally the substrate may be diced along the streets 115 as indicated by the pairs of dotted lines.

Figure 5:
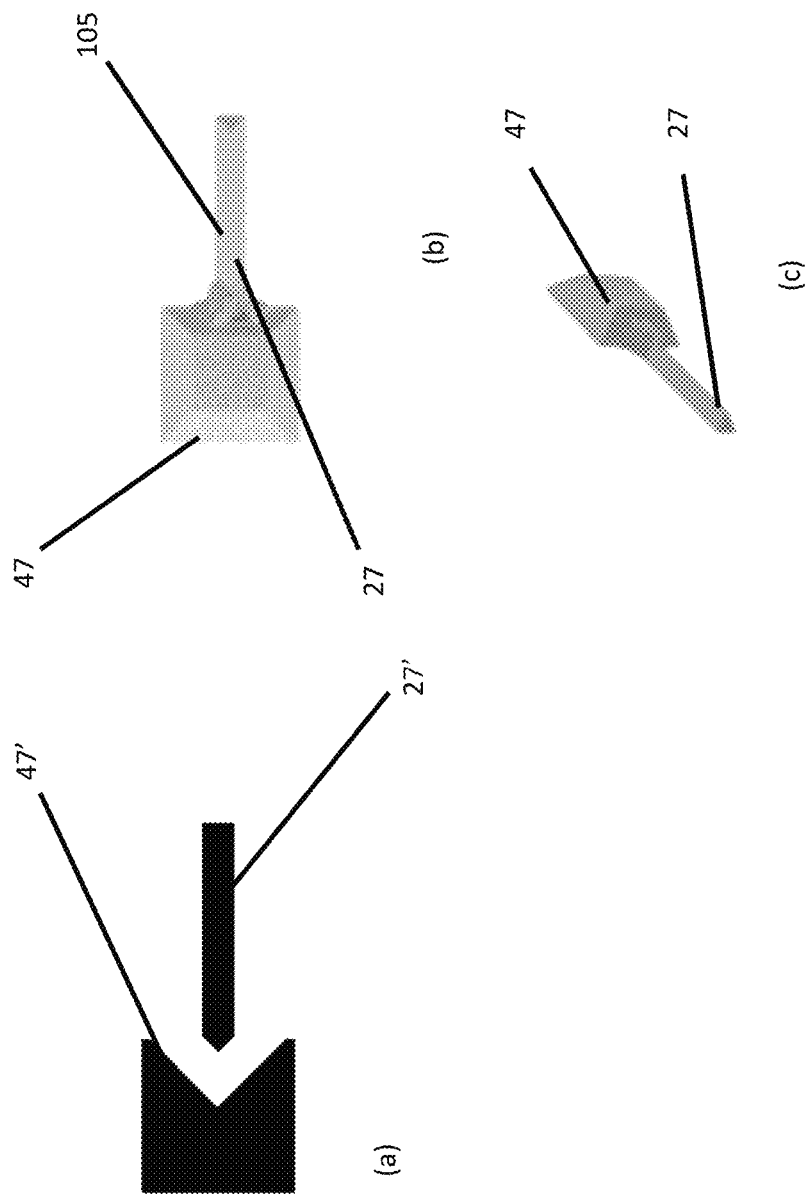
FIG. 5 is a mask set capable of making the prism wedge and the fiber trench; (a) is a perspective rendering of the mask set; (b) is an isometric drawing of the resulting wafer surface; and (c) is a perspective isometric drawing showing the wafer surface.

FIG. 5 shows an exemplary mask set for forming the first etched trench 27' and the ball lens mask 47'. For the nomenclature used here, the prime (') after the reference number may indicate the mask feature giving rise to the formation of that feature on the substrate. That is, for example, mask feature 47' may give rise to the formation of the ball lens void 47.

Noteworthy is that the ball lens mask 47 is substantially larger in area than the trench mask 27. Accordingly, the void 47 formed by etching through the ball lens mask 47' may be substantially broader than the trench 27 etched through the trench mask 27'. The dark areas may correspond to areas on the wafer surface with are not coated with a protective film, and thus are exposed to the etchant.

The etch methodology may be a wet or chemical etchant. Potassium hydroxide (KOH) is known to be an effective etchant for single crystal silicon, etching in one plane of the crystal at a much faster rate than other faces of the crystal. Strong alkaline substances (pH>12) such as aqueous KOHsolutions etch silicon via Si+4 OH-Æ Si(OH)4+4e-. Since the bonding energy of Si atoms is different for each crystal plane, and KOH Si etching is not diffusion—but etch rate limited, Si etching is highly anisotropic: While the {100}- and {110}-crystal planes are being etched, the stable {111} planes act as an etch stop. See, for example, https://www-.microchemicals.eu/technical_information/silicon_etching-.pdf. This preferential etching may result in the 54 degree angle between the surfaces and the bottom of the trench being formed. This inclined wall is particularly useful in the design described above. This inclined walls may provide a seating surface for the spherical ball lens as well and a reflective surface for total internal reflection of the horizontal.

The effect is shown in FIG. 5. The patterns shown in (a) are the mask set corresponding to trench 27' and ball lens void 47'. A plan view in solid model is shown in (b) wherein the grayscale is used to suggest the depth and shape of the resulting void. A perspective view is given in (c), which is a solid model drawing of the resulting trenches 25 and 45. As can be seen in FIG. 5(c), the void made by the ball lens mask 47 will be substantially broader and may be substantially deeper than the void made by the trench mask 27.

Figure 6:
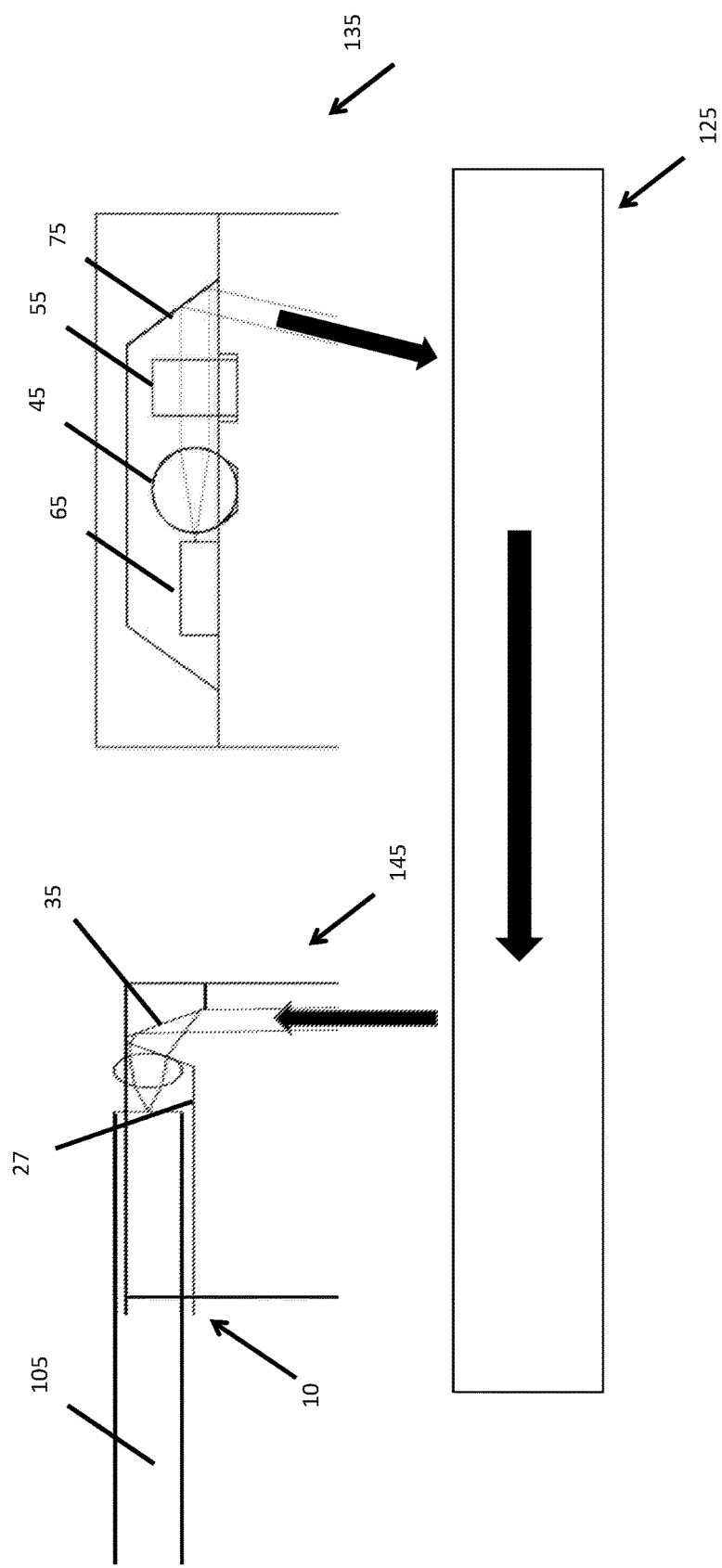
FIG. 6 is a schematic diagram of a laser source and a fiber block mounted on a photonics chip assembly.

FIG. 6 shows an application of the microfabricated fiber optic platform 10, which may correspond to device 10 or device 11 in FIG. 4.

In the embodiment shown in FIG. 6, the system may include an optical radiation emitter 135 and an optical radiation receiver 145. The emitter 135 may be a source of radiation which will be launched into fiber optic cable 105 in receiver 145. The radiation may be translated laterally in a photonic chip 125, which may perform an operation on the radiation such as wavelength selection or encoding of information on the radiation.

In FIG. 6, in the emitter 135, a radiation source 65 may emit radiation which may be collimated by a ball lens 45. From the ball lens 45, the radiation may impinge an optical isolator 55, which may be a quarter wave plate and a faraday rotator. The reflecting surface 35 may redirect radiation which was travelling substantially horizontally to a direction substantially vertical to the surface. The radiation may emerge from the bottom face of the emitting device 135.

The radiation may then impinge upon a photonic chip 125, which may include a variety of photonic devices. The photonic chip 125 may include, for example, Mach-Zehnder modulator, a vertical grating coupler, a transimpedance amplifier, for example. Because these components will depend on the application, they are shown schematically in FIG. 6., which couples radiation travelling vertically and transmits the radiation laterally a distance. The structure 125 may be, for example, a vertical grating coupler, but other optical elements can be used as well.

Finally, the radiation may emerge from the photonic chip 125 in a direction vertical, or orthogonal, to the plane of the substrate. Accordingly, the radiation may emerge in a direction perpendicular to its direction in the photonic chip 125.

The radiation may then be coupled into a receiver 145, which may be a fiber optic platform 10 or 11 as described above. The radiation may strike the substrate surface in a nominally vertical direction, orthogonal to the plane of the fiber optic 105 resting in the trench 27. This vertical radiation may be redirected to a second orthogonal direction, by total internal reflection off the reflecting surface 35 and into a second ball lens 45. Second ball lens 45 may shape the beam for efficient coupling into fiber optic cable 105.

It should be understood the orientational descriptors such as "up", "down", "left", "right", "horizontal" and "vertical" are intended to pertain to the structure as held in any arbitrary orientation, and so should be understood to be relative to a feature in the device itself, rather than as held in any particular orientation. For example, "horizontal" should be understood to be parallel to the major dimension of a typical semiconductor substrate, which is generally thin and circular, with a flat face (typically the fabrication surface) and a side obverse to this flat face. In this context, "horizontal" should be understood to mean substantially parallel to this flat face. "Vertical" should be understood to be orthogonal to this direction, and perpendicular to the flat face. The "top, planar" surface should be understood to mean this flat face or fabrication surface. "Substantially orthogonal" or "substantially parallel" should be understood to be within +/1 10 degrees of the exactly orthogonal or exactly parallel direction.

Accordingly, a platform is described for supporting a fiber optic cable. The platform may include a substrate having a top planar surface, a trench formed in the substrate in the top planar surface and dimensioned to accept a fiber optic cable, and a reflecting surface formed in the top planar surface configured to reflect radiation by total internal reflection, wherein the reflecting surface is configured to direct radiation travelling in a first direction into a second direction, substantially orthogonal to the first direction. In some embodiments, the first direction is parallel to the top planar surface and the second direction is substantially perpendicular to the planar surface. The platform may further comprise a ball lens disposed in a depression in the substrate top planar surface, wherein the depression is deeper than the trench, such that the ball lens rests in the depression and against the reflecting surface on the top planar surface. The platform may further comprise a fiber optic cable disposed in the trench on the top planar surface.

The platform may also include a second surface which accepts the light from the fiber optic cable and directs the radiation against the reflecting surface, wherein the second surface has an antireflection coating applied thereto. The reflecting surface and the second surface may form an angle of about 54 degrees with respect to the top planar surface of the substrate. The platform may further include a third surface disposed on the underside of the substrate, obvers to the top side, and having an antireflection coating applied thereto. The platform may further include an optical element disposed below the third surface, which at least one of emits, receives, or transduces the radiation. The optical element may at least one of a vertical cavity surface emitting laser (VCSEL), an edge-emitting laser, a detector, a Mach-Zehnder modulator, a transimpedance amplifier, and a vertical grating coupler.

Furthermore, a method is described for making a platform for supporting a fiber optic cable on a single crystal silicon substrate having a top planar surface. The method may include forming a trench in the single crystal silicon substrate in the top planar surface and dimensioning the trench to accept a fiber optic cable, and forming a reflecting surface in the single crystal silicon surface, wherein the reflecting surface is configured to reflect radiation by total internal reflection, wherein the reflecting surface is configured to direct radiation travelling parallel to the top planar surface into a direction substantially perpendicular to the planar surface. The method may also include disposing a ball lens in the trench and against the reflecting surface on the top planar surface. The method may also include disposing a fiber optic cable disposed in the trench on the top planar surface.

The method may also include forming a second surface in the single crystal silicon substrate which accepts the light from the fiber optic cable and directs the radiation against the reflecting surface, wherein the second surface has an antireflection coating applied thereto. The method may also include forming the reflecting surface and the second surface comprises forming the reflecting surface and the second surface at an angle of about 54 degrees with respect to the top planar surface of the substrate.

The method may also include applying an antireflection coating to a third surface on the underside of the single crystal silicon substrate, the underside being obverse to the top side. The method may also include disposing an optical element below the third surface, wherein the optical element at least one of emits, receives, or transduces the radiation. The optical element may at least one of an edge emitting laser, a vertical cavity surface emitting laser (VCSEL), a detector, or a vertical grating coupler. The trench and the reflecting surface may be made using a KOH etch. The depression for the ball lens may be deeper than the trench for the fiber optic cable. The substrate may comprise at least one of single crystal silicon, glass, aluminum nitride (AlN), and sapphire. The structure may include a plurality of trenches, a plurality of cables and a plurality of ball lenses.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Accordingly, the exemplary implementations set forth above, are intended to be illustrative, not limiting.

What is claimed is:

1. A platform for supporting a fiber optic cable, comprising:
   a single crystal substrate having a top planar surface;
   a trench with sidewalls formed in the substrate in the top planar surface and dimensioned to accept a fiber optic cable carrying radiation; and
   a reflecting surface formed in the top planar surface, wherein this reflecting surface is configured to reflect the radiation traveling inside the single crystal substrate by total internal reflection, wherein the reflecting surface is configured to direct radiation travelling in a first direction into a second direction, substantially orthogonal to the first direction.

2. The platform of claim 1, wherein the first direction is parallel to the top planar surface and the second direction is substantially perpendicular to the planar surface.

3. The platform of claim 1, further comprising:
   a ball lens disposed in a depression in the substrate top planar surface, wherein the depression is deeper than the trench, such that the ball lens rests in the depression and against sidewalls of the trench.

4. The platform of claim 3, further comprising:
   a fiber optic cable disposed in the trench on the top planar surface.

5. The platform of claim 1, further comprising:
   a second surface which accepts the light from the fiber optic cable and directs the radiation against the reflecting surface, wherein the second surface has an antireflection coating applied thereto.

6. The platform of claim 1, wherein the reflecting surface and the second surface form an angle of about 54 degrees with respect to the top planar surface of the substrate.

7. The platform of claim 1, further comprising:
   a third surface disposed on the underside of the substrate, obverse to the top side, and having an antireflection coating applied thereto.

8. The platform of claim 7, further comprising:
   an optical element disposed below the third surface, which at least one of emits, receives, or transduces the radiation.

9. The platform of claim 8, wherein the optical element is at least one of a vertical cavity surface emitting laser (VCSEL), an edge-emitting laser, a detector, a Mach-Zehnder modulator, a photodiode detector, and a vertical grating coupler.

10. A method for making a platform for supporting a fiber optic cable, comprising:
    providing a single crystal silicon substrate having a top planar surface;
    forming a trench with sidewalls in the single crystal silicon substrate in the top planar surface and dimensioning the trench to accept a fiber optic cable; and
    forming a reflecting surface in the single crystal silicon surface, wherein the reflecting surface is configured to reflect radiation traveling inside the single crystal silicon substrate by total internal reflection, wherein the reflecting surface is configured to direct radiation travelling parallel to the top planar surface into a direction substantially perpendicular to the planar surface.

11. The method of claim 10, further comprising:
    disposing a ball lens in the trench and against the sidewalls of the trench on the top planar surface.

12. The method of claim 10, further comprising:
    disposing a fiber optic cable disposed in the trench on the top planar surface.

13. The method of claim 12, further comprising:
    forming a second surface in the single crystal silicon substrate which accepts the light from the fiber optic cable and directs the radiation against the reflecting surface, wherein the second surface has an antireflection coating applied thereto.

14. The method of claim 10, wherein forming the reflecting surface and the second surface comprises forming the reflecting surface and the second surface at an angle of about 54 degrees with respect to the top planar surface of the substrate.

15. The method of claim 10, further comprising:
    applying an antireflection coating to a third surface on the underside of the single crystal silicon substrate, the underside being obverse to the top side.

16. The method of claim 10, further comprising:
    disposing an optical element below the third surface, wherein the optical element at least one of emits, receives, or transduces the radiation.

17. The method of claim 16, wherein the optical element is at least one of a vertical cavity surface emitting laser (VCSEL), a detector, or a vertical grating coupler.

18. The method of claim 9, wherein the trench is made using a KOH etch.

19. The method of claim 10, wherein the reflecting surface is made using a KOH etch.

20. The platform of claim 1, wherein the depression for the ball lens is deeper than the trench for the fiber optic cable.

21. The platform of claim 1, wherein the substrate comprises at least one of single crystal silicon, glass, aluminum nitride (AlN), and sapphire.

22. The platform of claim 4, further comprising a plurality of trenches, a plurality of cables and a plurality of ball lenses.

\* \* \* \* \*